United States Patent [19]

Callahan, Jr.

[11] 3,800,239

[45] Mar. 26, 1974

[54] CURRENT-CANCELING CIRCUIT

[75] Inventor: Michael James Callahan, Jr., Garland, Tex.

[73] Assignee: Texas Instruments Incorporated, Dallas, Tex.

[22] Filed: Nov. 24, 1972

[21] Appl. No.: 309,314

[52] U.S. Cl. .......... 330/40, 307/235 R, 307/299 B, 330/18, 330/25, 330/30 D, 330/38 M

[51] Int. Cl. ......... H03f 3/14, H03f 3/42, H03f 3/10

[58] Field of Search .......... 307/213, 215, 255, 288, 307/235 R, 299 R, 299 B, 297, 313; 330/25, 30 D, 38 M, 18, 19, 22, 40

[56] References Cited

UNITED STATES PATENTS

| | | | |
|---|---|---|---|
| 3,714,600 | 1/1973 | Kuijk et al. | 330/25 |
| 3,700,921 | 10/1972 | Gay | 307/299 BX |
| 3,633,052 | 1/1972 | Hanna | 307/299 B |
| 3,648,154 | 3/1972 | Frederiksen et al. | 330/30 DX |
| 3,614,645 | 10/1971 | Wheatley, Jr. | 330/30 D |
| 3,538,449 | 11/1970 | Solomon | 330/30 D |
| 3,629,691 | 12/1971 | Wheatley, Jr. | 307/297 X |
| 3,671,767 | 6/1972 | Davis | 307/299 BX |
| 3,717,821 | 2/1973 | Amemiya et al. | 330/30 DX |

*Primary Examiner*—Rudolph V. Rolinec
*Assistant Examiner*—L. N. Anagnos
*Attorney, Agent, or Firm*—James O. Dixon; Harold Levine; Gary C. Honeycutt

[57] ABSTRACT

A current-canceling circuit coupled to the input of a differential amplifier stage nulls normal input currents resulting from base bias and leakage currents. $H_{fe}$ match of only one pair of devices per input is required by utilizing a split collector transistor as a current source to supply compensation current to the input transistor.

3 Claims, 5 Drawing Figures

CURRENT-CANCELING CIRCUIT

This invention relates to current-canceling circuits coupled to the input of a differential stage in general and more specifically to current-canceling circuits employing a transistor having multiple output terminals as a current source.

An ideal differential stage exhibits an infinite input impedance so that zero input current is generated upon application of the input signal. However, conventional differential stages exhibit less than infinite input impedance, and accordingly an input current flows. Input currents generate voltages which provide unbalanced voltage conditions between the input terminals of the differential stage.

Base electrodes of bipolar transistors and gate electrodes of field effect transistors conventionally are utilized in differential pairs to receive the input signals, as each device exhibits a relatively high input impedance at that terminal. Currents in the input of the differential stage result from the base bias current of the bipolar transistor or from the gate leakage currents of the field effect transistors. Conventional DC coupled differential stages exhibit input bias currents which undesirably develop voltage drops in the circuits. Also, thermal drift gives rise to temperature-sensitive input error voltages complicating error compensation.

The electronics art has long sought an ideal differential stage, as many circuits require high impedance circuitry, such as transducer amplifiers and logarithmic amplifiers. One scheme utilized in providing improved input current characteristics employs utilization of input transistors having an ultrahigh common emitter amplification factor (beta). Another technique utilizes a current-canceling circuit to provide the necessary bias current and leakage current so that the input signal supplies zero current. A detailed discussion of current-canceling in general with one specific circuit therefore in particular is set forth in Tobey et al, Operational Amplifiers, Design and Applications, McGraw Hill, 1971, pages 67 to 78. The particular current-canceling circuit thereof is the subject matter of U.S. Pat. No. 3,551,832 to Graeme, for Transistor Base Current Compensation System, issued Dec. 29, 1970.

The above-referred current-canceling circuit has several inherent disadvantages. The degree of nulling is influenced by the absolute value of lateral pnp $H_{fe}$. It is understood that $H_{fe}$ is dc common emitter current gain, i.e. the dc beta value. High gain lateral pnp transistors are difficult to manufacture utilizing conventional manufacturing processes. Furthermore, the Graeme circuit requires the $H_{fe}$ matching of two pairs of transistor devices for each input utilized. Still further, an error term in the nulling current is generated which is unavoidable in junction-isolated devices due to finite collection of minority carriers at the reverse bias substrate of the lateral pnp transistors. And yet further, the collector base junctions of critical devices have biased voltages thereacross creating an amplified leakage state. Typically, a 5 percent error term is provided by the Graeme circuit when utilizing beta values of 200 for npn transistors and 20 for pnp transistors. The error may approach 10 percent if substrate current error is included.

Accordingly, it is an object of the present invention to provide an improved current-canceling circuit which is only minimally dependent upon absolute value of lateral pnp $H_{fe}$ matching.

It is another object to provide a circuit wherein substrate current is canceled by means of a balanced circuit configuration such that an error term is not generated therefrom.

It is still a further object of the present invention to require the beta match of only one pair of devices for each input used. It is still a further object of the present invention to utilize a split collector pnp transistor in providing equal biasing currents to null out normal input currents in a differential stage.

Briefly, and in accordance with the present invention, a current-canceling circuit is coupled to an input transistor of one conductivity type of a differential pair. The circuit comprises a second transistor of the one conductivity type connected in cascode with the input transistor and having a base coupled to a current source transistor of the other conductivity type for generating equal amounts of bias current to the bases of the input and second transistors. In one embodiment the current generator comprises a pnp split collector transistor with one collector coupling the base thereof to the base of the second transistor, and the other collector coupled to the base of the input transistor. In a preferred embodiment the current source further includes a second pnp transistor coupling the split collector pnp transistor to a the second npn transistor to reduce error current determining the amount of bias current supplied to the input transistor.

The novel features believed to be characteristic of this invention are set forth in the appended claims. The invention itself, however, as well as other objects and advantages thereof may best be understood by reference to the following detailed description when read in conjunction with the accompanying drawings; wherein FIG. 1 is a circuit schematic of a basic differential pair;

Figure 1:
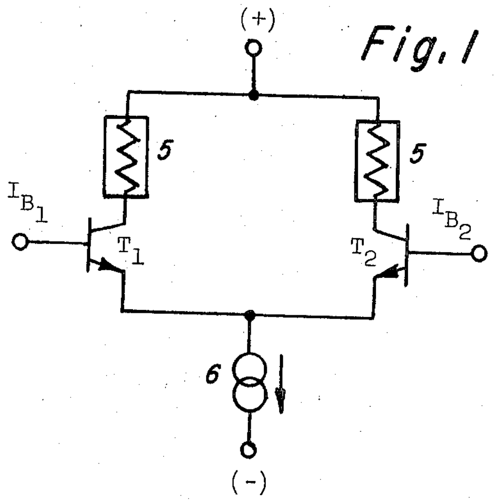

Referring now to the drawings, FIG. 1 depicts a basic differential pair. Input transistors T1 and T2 receive input signals $I_{B1}$ and $I_{B2}$ respectively which selectively actuate transistors T1 and T2. Current source 6 supplies operating current to the differential pair. Loads 5 may comprise a resistor coupled to an energization source. Specific operation of such circuits is well-known in the art.

Figure 2:
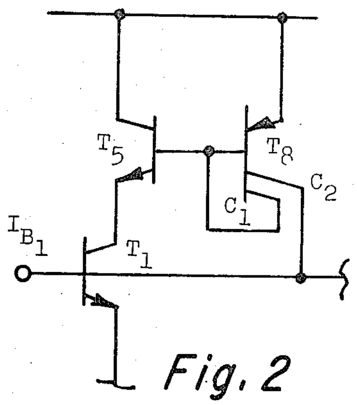
FIG. 2 is one embodiment of an improved current-canceling circuit of this invention.

FIG. 2 depicts an improved current-canceling circuit in accordance with one embodiment of this invention wherein only the input portion of the differential pair is shown. Transistor T5 is connected in cascode with T1 so that equal currents flow in both collector-emitter paths between current sources 5 and 6. Assuming that the betas of T1 and T5 ($\beta_1$ and $\beta_5$ respectively) are substantially equal, then equal amounts of base currents $I_{B1}$ and $I_{B5}$ are needed to drive each respective transistor. Supplying these substantially equal amounts of base drive current is current source transistor T8, a device having multiple output terminals. Preferably, T8 is a split collector pnp transistor having its base commonly connected with the base of transistor T5 and with one of the output terminals C1. The other output terminal C2 is coupled to the base of input transistor T1.

The invention is best understood by a brief description of the operation of the circuit of FIG. 2. As it is assumed that $\beta_1 = \beta_5$, and because the collector-emitter circuits of T1 and T5 are connected in series, equal current flows therein and equal base current respectively drive the transistors. Transistor T8 supplies this base current to transistor T5 through collector C1. A split collector transistor may be geometrically constructed so that equal collector currents flow in each collector terminal. Accordingly, the amount of current necessary to drive transistor T5 is supplied by the tied back collector C1 of transistor T8 and the other collector C2 supplies an equal amount of current to drive transistor T1 as desired.

The closed loop gain of transistor T8 is approximately equal to one because of the collector feedback. Assuming $\beta 1$ equals $\beta_5$, $\beta_8 = 1$, and neglecting substrate current then $$IC8/IB1 = \beta_1 \beta_8/(\beta_5 + 1). \quad \text{Eqn. 1}$$

The assumption that $\beta_1 = \beta_5$ is especially reasonable in integrated circuits wherein location of T1 in close proximity with T5 and a controllable process provides reasonable assurance of a substantial match. Also the assumption that substrate current may be neglected in the circuits of this invention employing a differential current source is reasonable in that even upon the event of substrate leakage the effect thereof does not unbalance the current flow in collectors C1 and C2. The error term is thereby not enhanced. That is, only a matching of the two collector segments with regard to substrate current is required, which is achieved utilizing the split collector device.

Substituting the typical data value of 200 for an npn transistor results in a 200/201 or 0.995 match. However, realistically the closed loop gain of transistor T8 is less than 1.0. A more accurate representation for $\beta 8$ is $$\beta 8 = H_{fe\,(OL)} /(1 = H_{fe\,(OL)} \cdot F) \quad \text{Eqn. 2}$$

Wherein F is a feedback factor approximating 1. Substituting this into Equation 1 results in $$Ic8/IB1 = 200/210 = 20/21 = .95. \quad \text{Eqn. 3}$$

Prior art current-cancelling circuits generate substantially the same 5 percent error term. However, the split collector pnp transistor design of this invention provides equal collector currents without requiring matching betas with a companion transistor connected therewith in series. As above noted, substrate current is also less of a factor when utilizing the split collector device as described.

In Equation 2 the feedback factor F was assumed to be 1 which is appropriate if $I_{b8}$ were negligible. But transistor T8 requires finite base drive current which may not be neglected. However, by reducing the effective drive current $I_{b8}$ of T8 (which supplies the drive current to transistor T5) the error term in Equation 3 is reduced.

Figures 3, 4, 5:
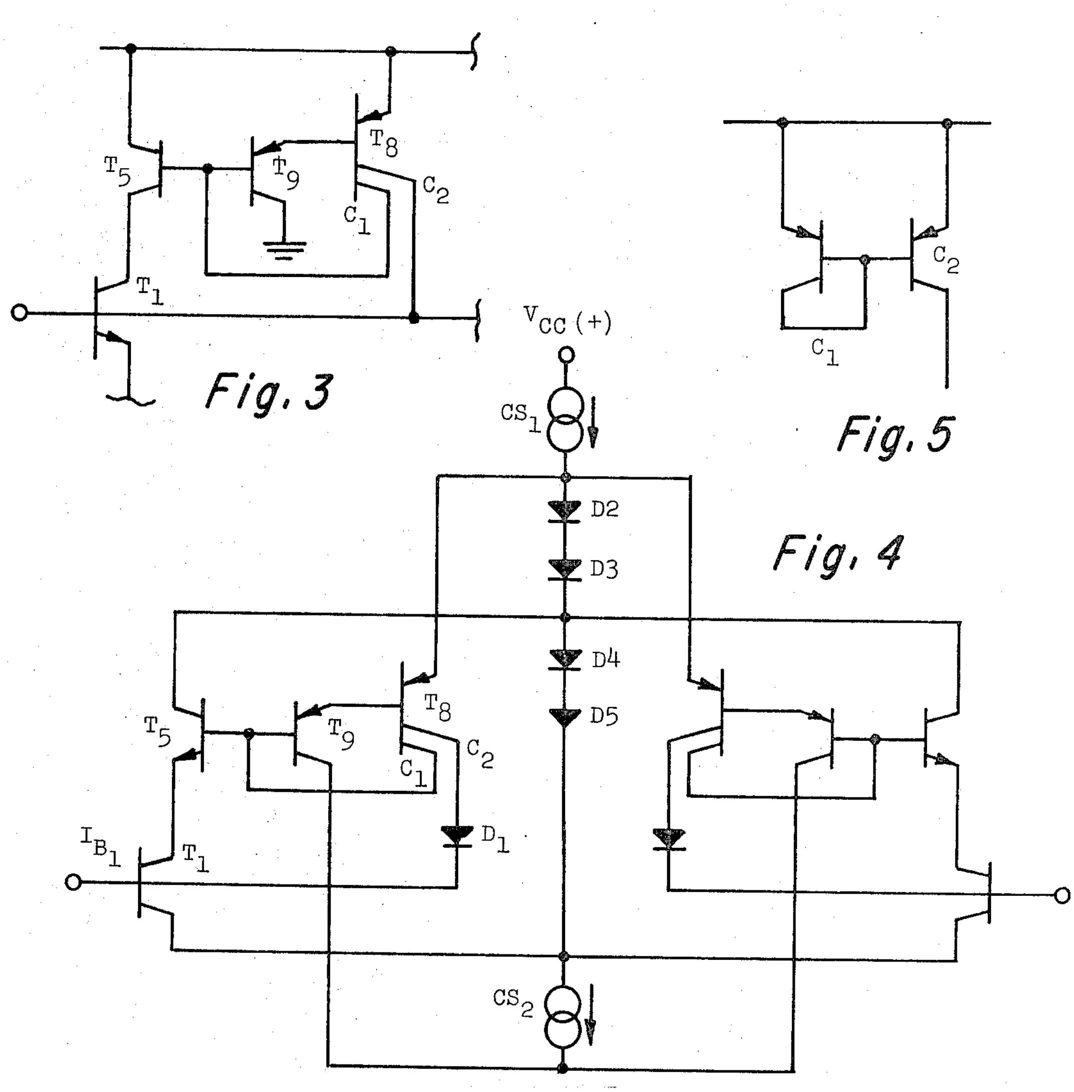
FIG. 3 is a second embodiment of an improved current-canceling circuit of the present invention.
FIG. 4 is a generalized circuit schematic of a differential pair employing the current-canceling circuit of this invention having optimum biasing.
FIG. 5 is a two-transistor equivalent for a multicollector device used as a current source.

The embodiment of FIG. 3 depicts an improved current-canceling technique wherein the feedback factor F of Equation 2 above more closely approximates 1. That is, the base and emitter of transistor T9 couples the bases of transistors T8 and T5 so that only $I_{b8}/(\beta 9 + 1)$ current is supplied to the base of transistor T5 from the base of transistor T8, the remainder of $I_{b8}$ is shunted to circuit ground by T9. Modifying Equation 3 so as to account for the pnp transistor T9 results in Equation 4.

$$I_{c8}/I_{b1} = \beta_1/\beta_5 + 1 \cdot H_{fe8} \,.\, H_{fe9}/1 + H_{fe8} \cdot H_{fe9} \cdot F. \quad \text{Eqn. 4}$$

Substituting typical beta values for npn transistors of 200 and $H_{fe}$ values of 20 and 70 respectively for lateral pnp and lateral-substrate pnp transistors respectively, Equation 4 reduces to $$Ic8/Ib1 = .994 \,. \quad \text{Eqn. 5}$$

In the expression of Equation 5, it is noted that the beta of the npn transistor pair becomes the significant error term. This is advantageous because *npn* $H_{fe}$ can be made very high relative to *pnp* $H_{fe}$.

By utilizing transistor T9 in FIG. 3, the operating current flowing in its collector-emitter circuit is relatively small, i.e., the base current from transistor T8. It is reasonably contemplated that a portion of the collector current of transistor T8 may be coupled to the base of T8, such as by utilization of a triple collector pnp transistor for T8 with the additional output tied back to the base thereof.

The preferred embodiment of FIG. 4 is shown depicted in a functional schematic of a biased differential pair. Because the right half circuit of FIG. 4 is the mirror image of the left half circuit, discussion is here limited to the left half. Diodes D2 through D5 couple current sources CS1 and CS2 which supply the operating current. The collector of transistor T5 is coupled to the emitter of transistor T8 by diodes D2 and D3. Diode D1 couples the base of input transistor T1 to one of the split collectors of transistor T8. The advantage of biasing the current-canceling circuit with diodes D1 – D5 is to provide transistor T1 and T5 with respective collector-base junctions having zero bias volts thereacross. This reduces junction leakage current so as to insure more ideal transistor characteristics, inherently necessary in Equations 1 and 4. Assuming that the base of T1 is at 0 volts, then it is readily calculated that the collector of T1 also lies at 0 volts as determined through the circuit comprising the base-emitter of T1, D5 - D2, and the base emitter path of transistors T8, T9 and T5. It is likewise seen that both the base and collector of transistor T5 reside at $1V_{be}$ above circuit ground with thus zero voltage drop across the base-collector junction. This circuit path comprises B-E of T1, and D5 to D4 to the collector of T5. Also noted is that diode D1 provides the fed back collector C2 of T8 a bias voltage of $1V_{be}$ above zero volts to maintain that collector at the same bias voltage as the non-fed back collector C1 which is connected to the base of transistor T5 (also residing at $1V_{be}$ above zero volts). Maintaining equal voltages on C1 and C2 assists in providing an equal amount of output current flowing therein.

FIG. 5 depicts a pair of three-terminal transistors having matched betas which in combination are functionally similar to the multi-collector device above described. The transistor pair has commonly connected bases and common emitters with one of the transistors having its collector tied back to the common bases. Collector C2 is adapted to be coupled to the base of the input transistor for current canceling in the spirit of this invention.

It is understood that elements D1 through D5, although depicted as diodes in FIG. 4, are merely representative of P/N junctions. Accordingly, base-emitter junctions of transistors are equally understood to be included. Although the preferred embodiments were set forth with regard to a specific transistor conductivity type, it is understood that the dual transistor circuit of opposite conductivity types is equally within the scope of this invention. It is still further understood that the bipolar transistors depicted herein may be suitably replaced by junction field effect transistors (JFETs). The embodiments of this invention are especially adapted for utilization in integrated circuits and are readily provided by techniques well-known to those skilled in the art. Various modifications to the details will be apparent to those skilled in the art without departing from the scope of the invention. Furthermore, it is understood that the multicollector device may also comprise a pair of three-terminal transistors having common emitters and common bases, with one of the transistors having its collector tied back to the common bases.

What is claimed is:

1. In a differential stage electrical amplifier having a pair of npn input transistor for receiving first and second input signals at the respective base electrodes thereof, a current canceling circuit coupled to one of said input transistors comprising:

a. a third npn transistor having its emitter coupled to the collector of one of said pair of input transistors, b. a first pnp transistor having its base commonly connected to the base of third npn transistor and having its collector coupled to a first energization source, c. a second pnp transistor having a plurality of collectors, one of said collectors connected to the base of said third npn transistor, and having its base connected to the emitter of said first pnp transistor, and having its emitter connected to a second energization source, d. a first set of serially connected diodes connecting said second energization source to the collector of said third npn transistor, e. a second set of serially connected diodes serially connected between said first set of diodes and the emitter of said one input transistor, and f. at least another diode connecting the other of said plurality of collectors of said second pnp transistor to the base of said one input transistor, thereby providing a biased differential stage having a compensated input for canceling input current to the stage.

2. The differential stage according to claim 1 wherein said first and second sets of diodes each consists of two diodes.

3. The differential stage according to claim 2 wherein said second pnp transistor consists of a multi-collector lateral pnp transistor integrated in combination with said other transistors and diodes in a single semiconductor chip.

* * * * *

UNITED STATES PATENT OFFICE
CERTIFICATE OF CORRECTION

Patent No. 3,800,239 Dated March 26, 1974

Inventor(s) Michael James Callahan, Jr.

It is certified that error appears in the above-identified patent and that said Letters Patent are hereby corrected as shown below:

In Equation 1 (Column 3, Line 23), "IC8/IB1" has been changed to --$I_{C2}/I_{B1}$--.

In Equation 2 (Column 3, Line 44), "$H_{fe_{(OL)}}/(1 = H_{fe_{(OL)}} \cdot F)$" has been changed to --$H_{fe_{(OL)}}/(1 + H_{fe_{(OL)}} \cdot F) = \frac{20}{1 + 20 \cdot 1} = \frac{20}{21}$--.

In Column 3, Line 47, after "approximating 1" the following has been inserted --, and 20 is the typical data value for a small pnp transistor--.

In Equation 3 (Column 3, Line 49), "Ic8/IB1 = (200/210) = (20/21) = .95" has been changed to --$I_{C2}/I_{B1} = (200/201).(20/21) = .95$--.

UNITED STATES PATENT OFFICE

CERTIFICATE OF CORRECTION

Patent No. 3,800,239 Dated March 26, 1974

Inventor(s) Michael James Callahan, Jr.

It is certified that error appears in the above-identified patent and that said Letters Patent are hereby corrected as shown below:

In Equation 4 (Column 4, Line 10), "$I_{c8}/I_{b1}$ = " has been changed to --$I_{C2}/I_{B1}$ = --.

In Equation 5 (Column 4, Line 17), "Ic8/Ibl" has been changed to --$I_{C2}/I_{B1}$--.

Signed and Sealed this

*Third* Day of *November 1981*

[SEAL]

*Attest:*

GERALD J. MOSSINGHOFF

*Attesting Officer* *Commissioner of Patents and Trademarks*